(12) United States Patent
Rowlands et al.

(10) Patent No.: US 12,193,338 B2
(45) Date of Patent: Jan. 7, 2025

(54) RESERVOIR COMPUTER WITH A SERIES ARRAY OF JOSEPHSON JUNCTIONS

(71) Applicant: RAYTHEON BBN TECHNOLOGIES CORP., Cambridge, MA (US)

(72) Inventors: Graham Earle Rowlands, Arlington, MA (US); Thomas Akira Ohki, Arlington, MA (US); Guilhem Jean Antoine Ribeill, Arlington, MA (US); Minh-Hai Nguyen, Arlington, MA (US)

(73) Assignee: RTX BBN TECHNOLOGIES, INC., Cambridge, MA (US)

( * ) Notice: Subject to any disclaimer, the term of this patent is extended or adjusted under 35 U.S.C. 154(b) by 1087 days.

(21) Appl. No.: 17/094,694

(22) Filed: Nov. 10, 2020

(65) Prior Publication Data

US 2022/0093841 A1 Mar. 24, 2022

Related U.S. Application Data

(60) Provisional application No. 63/081,891, filed on Sep. 22, 2020.

(51) Int. Cl.
*H10N 60/01* (2023.01)
*G06N 3/063* (2023.01)
*G06N 10/00* (2022.01)
*G11C 11/44* (2006.01)
*G11C 11/54* (2006.01)
(Continued)

(52) U.S. Cl.
CPC ......... *H10N 60/0912* (2023.02); *G06N 3/063* (2013.01); *G06N 10/00* (2019.01); *G11C 11/44* (2013.01); *G11C 11/54* (2013.01); *H10N 60/12* (2023.02); *H10N 60/128* (2023.02)

(58) Field of Classification Search
CPC .................................................. H10N 60/0912
See application file for complete search history.

(56) References Cited

U.S. PATENT DOCUMENTS

| 8,571,614 | B1 | 10/2013 | Mukhanov et al. |
| 2003/0039138 | A1* | 2/2003 | Herr .................. H03K 5/00006 365/162 |

(Continued)

FOREIGN PATENT DOCUMENTS

WO 2021047891 A1 3/2021

OTHER PUBLICATIONS

Schwartz, et al. "Antiphase Switching in Josephson Junction Arrays", Physical Review Letters, vol. 73, No. 21, Nov. 21, 1994,) XP055851041 (pp. 2797-2800.
(Continued)

*Primary Examiner* — Paul A Wartalowicz
(74) *Attorney, Agent, or Firm* — CANTOR COLBURN LLP

(57) ABSTRACT

A reservoir computer. In some embodiments, the reservoir computer includes a series array of Josephson junctions, a coupling impedance, and a readout circuit. In some embodiments, the series array of Josephson junctions includes a plurality of Josephson junctions, connected in series; the coupling impedance is connected in parallel with the series array of Josephson junctions; and the readout circuit is connected to at least three nodes of the series array of Josephson junctions.

12 Claims, 4 Drawing Sheets

(51) Int. Cl.
  *H10N 60/10* (2023.01)
  *H10N 60/12* (2023.01)

(56) References Cited

U.S. PATENT DOCUMENTS

| 2015/0092465 | A1 | 4/2015 | Herr et al. |
| 2017/0212860 | A1* | 7/2017 | Naaman ............... H10N 60/12 |
| 2020/0044632 | A1 | 2/2020 | Powell, III et al. |
| 2021/0027138 | A1 | 1/2021 | Bedau et al. |
| 2022/0012623 | A1 | 1/2022 | Rowlands et al. |

OTHER PUBLICATIONS

Watanabe, et al. "Stability of periodic solutions in series arrays of Josephson junctions with internal capacitance", arxiv.org, Cornell University Library, 201 Olin Library Cornell University Ithaca, NY 14853, Nov. 1, 1996, XP080807793 (pp. 1-41).

Invitation to Pay Additional Fees and, Where Applicable, Protest Fee from corresponding International Patent Application No. PCT/US2021/041687, Invitation to Pay Additional Fees mailed Nov. 5, 2021 (11 pgs.).

Bai, K. et al., "DFR: An Energy-efficient Analog Delay Feedback Reservoir Computing System for Brain-inspired Computing", ACM Journal on Emerging Technologies in Computing Systems, Dec. 2018, pp. 1-22, vol. 14, No. 4, Article 45, Association for Computing Machinery.

Hadley, P. et al., "Phase locking of Josephson-junction series arrays", Physical Review B, Nov. 1, 1988, pp. 8712-8719, vol. 38, No. 13, The American Physical Society.

Jensen, J. H. et al., "Reservoir Computing with a Chaotic Circuit", Proceedings of the ECAL 2017, The MIT Press, Sep. 4-8, 2017, pp. 222-229, Massachusetts Institute of Technology.

Tanaka, G. et al., "Recent advances in physical reservoir computing: A review", Neural Networks, Mar. 20, 2019, pp. 100-123, Elsevier Ltd.

Vatin, J. et al., "Experimental reservoir computing using VCSEL polarization dynamics", Optics Express, Jun. 18, 2019, pp. 18579-18584, vol. 27, No. 13.

International Search Report from corresponding International Application No. PCT/US2021/041687, filed Jul. 14, 2021, International Search Report dated Oct. 25, 2021 and mailed Jan. 7, 2022 (6 pgs.).

Written Opinion of the International Searching Authority from corresponding International Application No. PCT/US2021/041687, filed Jul. 14, 2021, Written Opinion of the International Searching Authority mailed Jan. 7, 2022 (8 pgs.).

Coulombe et al., "Computing with networks of nonlinear mechanical oscillators", PLOS One, Jun. 2, 2017, pp. 1-13.

International Search Report and Written Opinion for PCT Application No. PCT/US2021/040925, dated Nov. 10, 2021, pp. 1-16.

Likharev et al., "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991, pp. 3-28.

Ma et al., "A Mott Insulator-based Oscillator Circuit for Reservoir Computing", IEEE Xplore, 2020, pp. 1-5.

Rowlands et al., "Reservoir Computing with Superconducting Electronics", Cornell University Library, Mar. 2020, pp. 1-6.

* cited by examiner

RESERVOIR COMPUTER WITH A SERIES ARRAY OF JOSEPHSON JUNCTIONS

CROSS-REFERENCE TO RELATED APPLICATION(S)

The present application claims priority to and the benefit of U.S. Provisional Application No. 63/081,891, filed Sep. 22, 2020, entitled "RESERVOIR COMPUTER WITH A SERIES ARRAY OF JOSEPHSON JUNCTIONS", the entire content of which is incorporated herein by reference.

FIELD

One or more aspects of embodiments according to the present invention relate to reservoir computers, and more particularly to a reservoir computer including a series array of Josephson junctions.

BACKGROUND

Reservoir computers may be employed for various computational tasks. Some such tasks may have significant throughput requirements, not readily met by related art reservoir computers.

Thus, there is a need for an improved reservoir computer.

SUMMARY

According to an embodiment of the present invention, there is provided a system, including: a series array of Josephson junctions; a coupling impedance; and a readout circuit, wherein: the series array of Josephson junctions includes a plurality of Josephson junctions, connected in series, the coupling impedance is connected in parallel with the series array of Josephson junctions, and the readout circuit is connected to at least three nodes of the series array of Josephson junctions.

In some embodiments, the system further includes a current source connected in series with the parallel combination of the series array of Josephson junctions and the coupling impedance.

In some embodiments, a first Josephson junction of the series array of Josephson junctions has a Stewart McCumber parameter within 50% of 1.0.

In some embodiments: a first Josephson junction of the series array of Josephson junctions has a first critical current; a second Josephson junction of the series array of Josephson junctions has a second critical current; and the second critical current differs from the first critical current by at least 2%.

In some embodiments, the system further includes an external shunt capacitor connected in parallel with a first Josephson junction of the series array of Josephson junctions.

In some embodiments, the system further includes a first external shunt resistor connected in parallel with the first Josephson junction.

In some embodiments: the coupling impedance includes a resistor having a resistance within 30% of N times a resistance of the first external shunt resistor, and N is the number of Josephson junctions in the series array of Josephson junctions.

In some embodiments, the coupling impedance includes an inductor.

In some embodiments: the inductor has an inductance within 30% of 3N times a Josephson inductance of a Josephson junction of the series array of Josephson junctions, and N is the number of Josephson junctions in the series array of Josephson junctions.

In some embodiments, the series array of Josephson junctions includes 3 Josephson junctions.

In some embodiments, the series array of Josephson junctions includes 5 Josephson junctions.

In some embodiments, the readout circuit is connected to at most 15 nodes of the series array of Josephson junctions.

In some embodiments, the system further includes a data transmission channel, generally connected to the series array of Josephson junctions.

According to an embodiment of the present invention, there is provided a method, including: training a reservoir computer; and operating the reservoir computer, wherein: the reservoir computer includes: a series array of Josephson junctions, a coupling impedance, and a readout circuit, the series array of Josephson junctions includes a plurality of Josephson junctions, connected in series, the coupling impedance is connected in parallel with the series array of Josephson junctions, and the readout circuit is connected to at least three nodes of the series array of Josephson junctions.

In some embodiments, the training includes: transmitting data through a data transmission channel to form received data; processing the received data with the reservoir computer to form processed data; and adjusting weights of the readout circuit to minimize a cost function, the cost function being based on a difference between transmitted data and processed data.

In some embodiments, the reservoir computer further includes a current source connected in series with the parallel combination of the series array of Josephson junctions and the coupling impedance.

In some embodiments: a first Josephson junction of the series array of Josephson junctions has a first critical current; a second Josephson junction of the series array of Josephson junctions has a second critical current; and the second critical current differs from the first critical current by at least 2%.

In some embodiments, the reservoir computer further includes a first external shunt resistor connected in parallel with the first Josephson junction.

In some embodiments: the coupling impedance includes a resistor having a resistance within 30% of N times a resistance of the first external shunt resistor, and N is the number of Josephson junctions in the series array of Josephson junctions.

In some embodiments: the coupling impedance includes an inductor having an inductance within 30% of 3N times a Josephson inductance of a Josephson junction of the series array of Josephson junctions, and N is the number of Josephson junctions in the series array of Josephson junctions.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a reservoir computer with a series array of Josephson provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
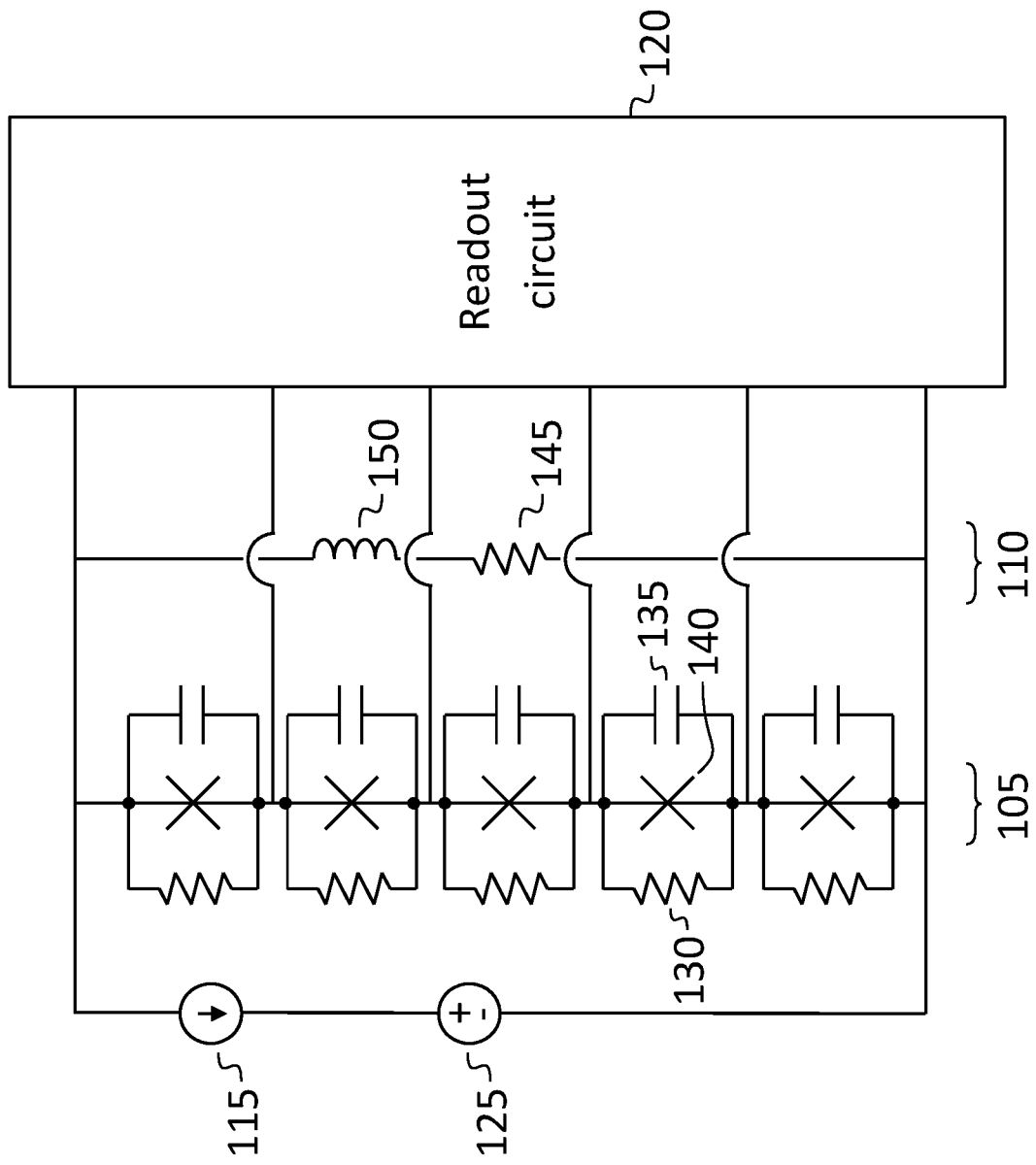
FIG. 1 is a schematic diagram of a reservoir computer, according to an embodiment of the present invention.

Referring to FIG. 1, in some embodiments, a reservoir computer includes a series array of Josephson junctions 105, a coupling impedance 110, connected in parallel with the series array of Josephson junctions 105, a current source 115, connected in series with the parallel combination of the series array of Josephson junctions 105 and the coupling impedance 110, and a readout circuit 120. The current source 115 may provide a DC bias current, part of which may flow through the series array of Josephson junctions 105, and part of which may flow through the coupling impedance 110. An input signal source 125 may be connected in series with the current source 115. An external network, e.g., a shunt resistor 130 and a shunt capacitor 135, may be connected in parallel with each of the Josephson junctions 140. In some embodiments, the total capacitance (including the capacitance of the Josephson junction 140 and the shunt capacitor 135) is about 0.2 pF-1.0 pF, and the resistance of the shunt resistor 130 is about 4 Ohms. In some embodiments the value of each of the external shunt capacitors 135 may be selected to tune the oscillation frequency of a respective Josephson junction.

The coupling impedance 110 may include (i) a resistor 145 (e.g., a resistor having a resistance equal to (or within 50% of) N R, where N is the number of Josephson junctions in the series array of Josephson junctions 105, and R is the resistance of the external shunt resistor 130, and (ii) an inductor 150 having an inductance equal to (or within 50% of) 3 N $L_0$, where $L_0$ is the Josephson inductance. In some embodiments, the coupling impedance is a different network, e.g., a resistor, an inductor, and a capacitor connected in series, or a network including parallel or series combinations, or both, of elements each of which may be a resistor, an inductor, or a capacitor.

In operation, the portion of the circuit including the series array of Josephson junctions 105, the coupling impedance 110, and the current source 115 may operate as a reservoir, which, as a result of its nonlinear dynamics, maps input signals into a higher dimensional computational space (e.g., the space corresponding to the oscillatory state of each of the Josephson junctions 105). In order for the reservoir to possess a sufficient number of independent dimensions, the reservoir may be configured so that the Josephson junctions of the series array of Josephson junctions 105 oscillate, in operation, at three or more (or, in some embodiments, five or more) different frequencies of operation (e.g., such that there are at least three (or, in some embodiments, at least five) Josephson junctions and such that each of the Josephson junctions of the series array of Josephson junctions 105 oscillates at a different frequency from the others). This may be accomplished by (i) selecting the quality factor of the Josephson junctions to be sufficiently high, (ii) selecting the natural frequencies of the Josephson junctions to be sufficiently different, (iii) selecting the critical currents of the Josephson junctions to be sufficiently different, or (iv) selecting the coupling (e.g., through the coupling impedance 110) to be sufficiently weak, that no pair of Josephson junctions of the series array of Josephson junctions 105 become synchronized (e.g., synchronized as a result of injection-locking, or synchronized as a result of pull-in between the oscillators). If synchronization of the Josephson junctions occurs, it may cause the reservoir computer to behave in a manner similar to that of a reservoir computer with fewer (e.g., $N_s-1$ fewer, where $N_s$ is the number of synchronized Josephson junctions) Josephson junctions, none of which are synchronized. In some embodiments, the reservoir computer includes a relatively small number of Josephson junctions, e.g., fewer than 15 Josephson junctions, e.g., three or five Josephson junctions.

In some embodiments, the likelihood of any pair of the Josephson junctions becoming synchronized may be reduced by (i) designing the Josephson junctions to have critical currents spanning a range (e.g., a range of 10% around a nominal value, so that, for example, for a reservoir including five Josephson junctions, the critical currents may be spaced apart by about 2% from each other), or (ii) by selecting other design parameters to have values that, in simulations (e.g., simulations using WR Spice, or any other suitable circuit simulation program including a model of a Josephson junction), do not cause synchronization. Such other design parameters include the bias current, the coupling impedance 110, and the Stewart McCumber parameter (which may be referred to as $\beta_c$, with $\beta_c = 2\pi I_c R^2 C/\Phi_0$ where $I_c$ is the critical current of the Josephson junction, R the shunt resistance, C the total capacitance, and $\Phi_0$ the flux quantum). In some embodiments, the Stewart McCumber is selected to be approximately 1.0 (e.g., within 50% of 1.0).

The bias current (provided by the current source 115) may be larger than the (largest) critical current of the Josephson junctions, so that the junctions remain in their voltage states. Each Josephson junction in the voltage state may exhibit high-frequency voltage oscillations that are measurable across its terminals. The coupling impedance 110 may provide coupling between the Josephson junctions because, for example, an oscillating voltage generated by one of the Josephson junctions may appear (i) across the coupling impedance 110 and (ii) across the remainder of the Josephson junctions in the series array of Josephson junctions 105. As such, if the coupling impedance 110 is very large, the coupling between the Josephson junctions may be small (which may result in a reduction in the performance of the reservoir computer). If the coupling impedance 110 is very small, the coupling between the Josephson junctions may also be small, because in such a circuit (unless the coupling impedance 110 includes a DC-blocking capacitor) the bias current may flow primarily through the coupling impedance 110, resulting in a small fraction of the bias current flowing through the Josephson junctions.

The readout circuit 120 may be connected to two or more (e.g., to all) of the nodes of the series array of Josephson junctions 105 (e.g., to all of (i) the two nodes at the two ends of the series array of Josephson junctions 105, and (ii) the N−1 nodes between adjacent Josephson junctions of the series array of Josephson junctions 105, where N is the number of Josephson junctions in the series array of Josephson junctions 105). This may enable the measuring of the voltage across each of the Josephson junctions. The readout circuit 120 may include a matrix of weights, or "weight matrix", that may be adjusted or "trained" so that the reservoir computer performs a computing task. The training may be supervised training in which a cost function (e.g., a cost function based on a difference between an output of the reservoir computer and the desired or "correct" output of the reservoir computer) is minimized (e.g., using a least mean squares (LMS) method).

The series array of Josephson junctions 105 may be in a refrigerator employed to keep it at cryogenic temperatures. In operation, each of the Josephson junctions may be in oscillate at a frequency between 100 GHz and 200 GHz. The readout circuit 120 may include, for each of the nodes of the series array of Josephson junctions 105 that are being read out by the readout circuit 120, a single flux quantum (SFQ) to DC converter, which may, in operation, have the effect of applying low-pass filtering to the signals from the nodes. The low-pass filtered signals may then more readily be transmitted out of the refrigerator to room-temperature circuits, including, e.g., (analog or digital) circuits (e.g., a processing circuit, discussed in further detail below) for multiplying the low-pass filtered signals by the weights of the weight matrix.

In some embodiments, the reservoir computer is used to compensate for degradation of a four-level pulse amplitude modulation (4PAM) signal upon transmission through a channel or "data transmission channel". The channel may degrade the signal through various mechanisms, e.g., multipath fading, a nonlinear response (e.g., saturation), and noise. The reservoir computer may be trained by transmitting known data through the channel, and adjusting the weights of the weight matrix, as mentioned above, by minimizing (e.g., using a least mean squares (LMS) method) a cost function based on the difference between an output of the reservoir computer and the known data transmitted through the channel.

Figure 2A:
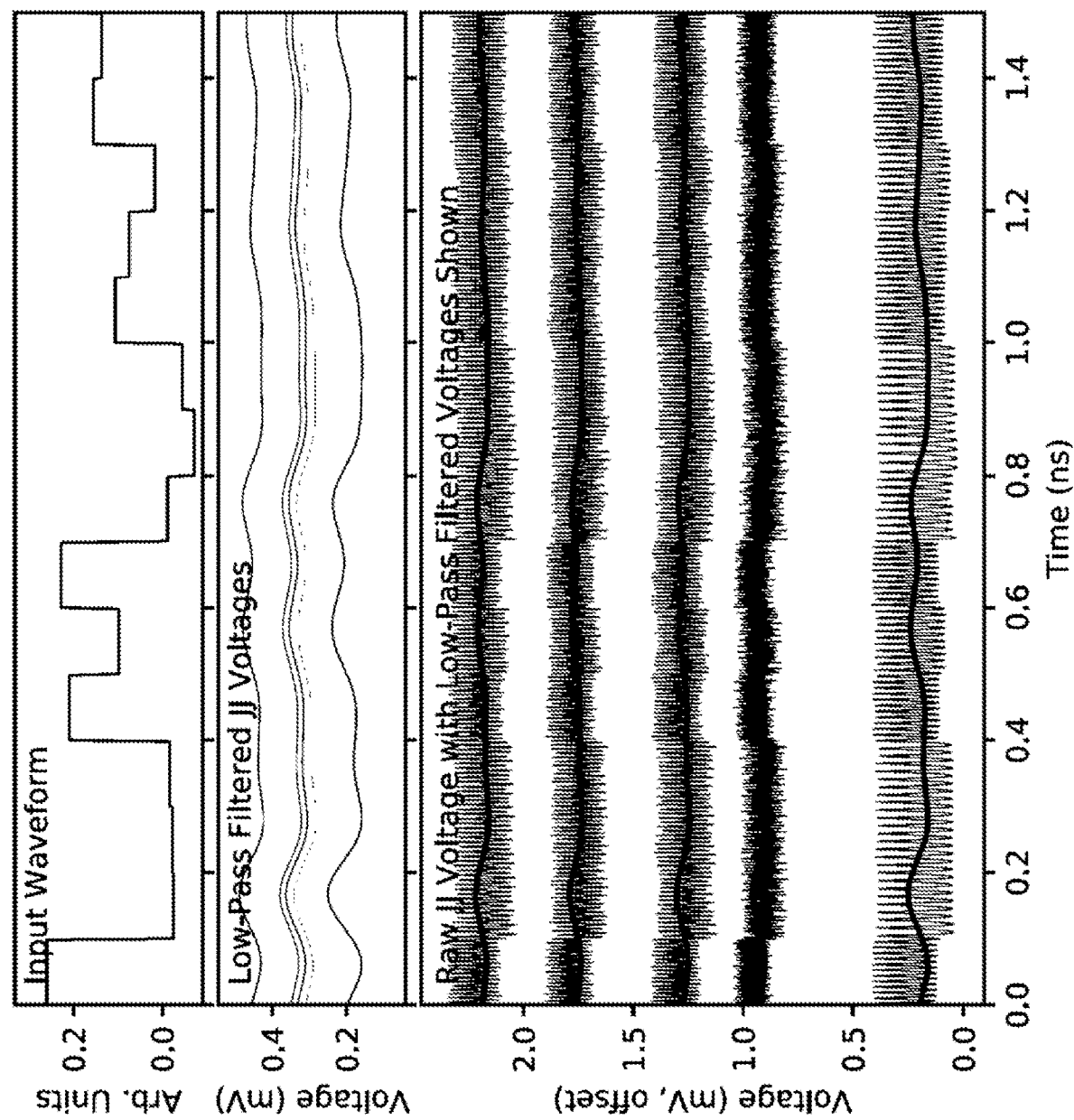
FIG. 2A is a graph of simulation results, according to an embodiment of the present invention.
Figure 2B:
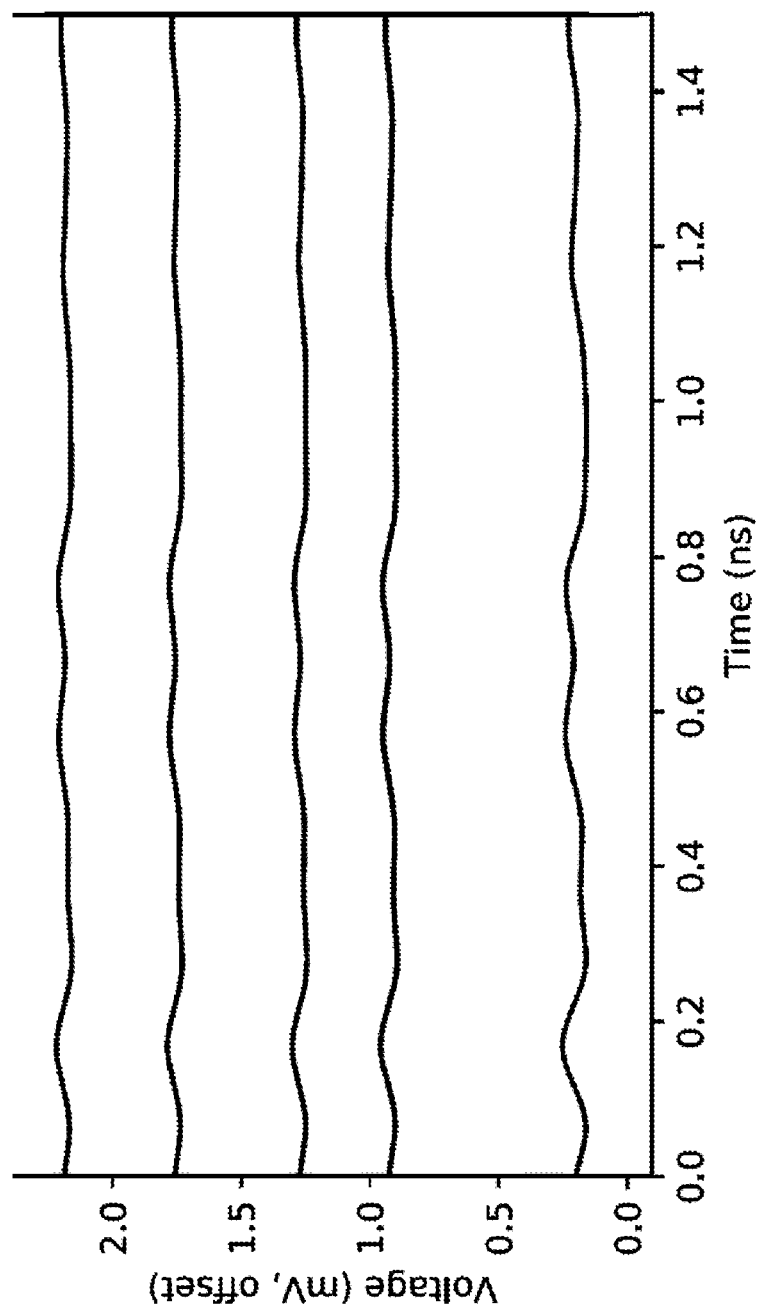
FIG. 2B is a graph of simulation results, according to an embodiment of the present invention.

Such an embodiment was simulated, for a reservoir computer including five Josephson junctions, and with a simulated channel that includes multi-path fading, a nonlinear response (e.g., saturation) and additive white Gaussian noise (AWGN). In the simulation, the reservoir computer was trained with 15,100 data points (each being a 4PAM symbol transmitted through the channel). FIG. 2A shows waveforms from the operation of the reservoir computer after training, including the input waveform, the low-pass filtered voltages across the Josephson junctions, and the raw voltages across the Josephson junctions. In the input waveform, the effect of the additive white Gaussian noise, which causes significant interference between the four levels of the pulse amplitude modulation, may be seen. The applied current $I(t)=I_b+I_s(t)$ consists of static bias current $I_b=1.55\ I_c$ and signal $I_s(t)$ whose dynamic range is roughly 0.3 $I_c$. The sample-and-hold time is 80 ps. A 2-bit 4PAM modulation scheme is used. FIG. 2B shows the low-pass filtered voltages across the Josephson junctions, arranged in the same order as the raw voltages across the Josephson junctions shown in the lower part of FIG. 2A.

Figure 3:
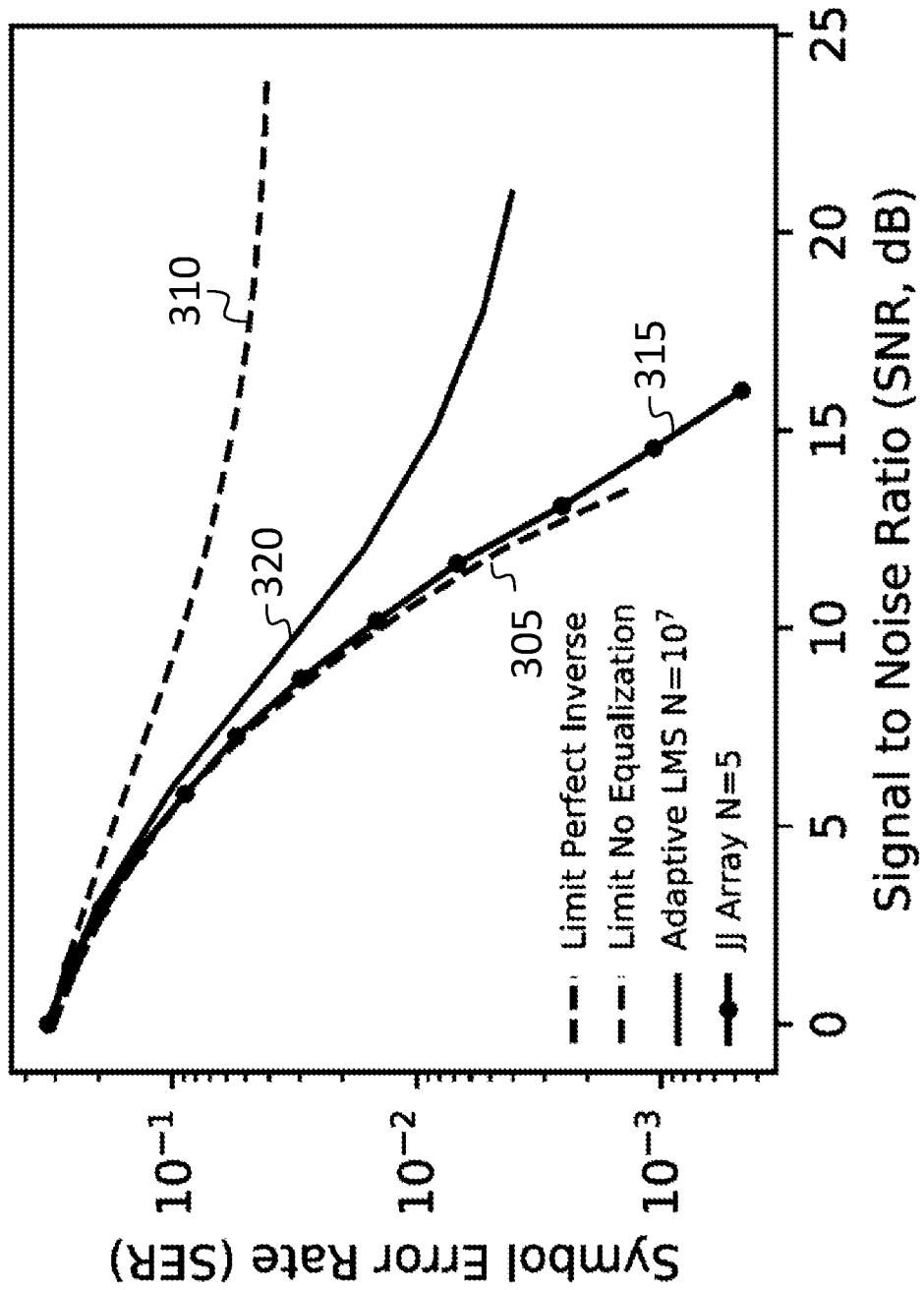
FIG. 3 is a graph of simulation results, according to an embodiment of the present invention.

FIG. 3 shows simulated channel equalization performance as a function of the per-bit signal to noise ratio (SNR) for a reservoir computer with N=5, i.e., with a series array of Josephson junctions 105 including five (unsynchronized) Josephson junctions. The expected lower symbol error rate (SER) bound with the exact channel inverse is shown by a first curve 305, while the expected upper SER bound (assuming no equalization has been performed) is shown by a second curve 310. The reservoir computer performs at the limit of the perfect channel inverse, as shown by a third curve 315. A fourth curve 320 shows the performance of a related art adaptive least-mean-squares (LMS) equalizer trained on $10^7$ points.

The throughput of the reservoir computer is relatively high: a sample-and-hold time of 80 ps may enable equalization at a rate of 25 Gb/s.

As used herein, when a second number is "within Y %" of a first number, it means that the second number is at least $(1-Y/100)$ times the first number and the second number is at most $(1+Y/100)$ times the first number. As used herein, the word "or" is inclusive, so that, for example, "A or B" means any one of (i) A, (ii) B, and (iii) A and B.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that when an element or layer is referred to as being "on", "generally connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, "generally connected" means connected by an electrical path that may contain arbitrary intervening elements, including intervening elements the presence of which qualitatively changes the behavior of the circuit. As used herein, "connected" (e.g., in the phrase "connected in series" or in the phrase "connected in parallel") means (i) "directly connected" or (ii) connected with intervening elements, the intervening elements being ones (e.g., low-value resistors or inductors, short sections of transmission line) that do not qualitatively affect the behavior of the circuit.

Although limited embodiments of a reservoir computer with a series array of Josephson junctions have been specifically described and illustrated herein, many modifications and variations will be apparent to those skilled in the art. Accordingly, it is to be understood that a reservoir computer with a series array of Josephson junctions employed according to principles of this invention may be embodied other than as specifically described herein. The invention is also defined in the following claims, and equivalents thereof.

What is claimed is:

1. A system, comprising:
    a series array of Josephson junctions;
    a coupling impedance; and
    a readout circuit,
    wherein:
        the series array of Josephson junctions comprises a plurality of Josephson junctions, connected in series,
        the coupling impedance is connected in parallel with the series array of Josephson junctions,
        the readout circuit is connected to at least three nodes of the series array of Josephson junctions;
        a first Josephson junction of the series array of Josephson junctions has a first critical current;
        a second Josephson junction of the series array of Josephson junctions has a second critical current; and
        the second critical current differs from the first critical current by approximately 2%.

2. The system of claim 1, further comprising a current source connected in series with the parallel combination of the series array of Josephson junctions and the coupling impedance.

3. The system of claim 1, wherein a first Josephson junction of the series array of Josephson junctions has a Stewart McCumber parameter within 50% of 1.0.

4. The system of claim 1, further comprising an external shunt capacitor connected in parallel with a first Josephson junction of the series array of Josephson junctions.

5. The system of claim 4, further comprising a first external shunt resistor connected in parallel with the first Josephson junction.

6. The system of claim 5, wherein:
    the coupling impedance comprises a resistor having a resistance within 30% of N times a resistance of the first external shunt resistor, and
    N is the number of Josephson junctions in the series array of Josephson junctions.

7. The system of claim 1, wherein the coupling impedance comprises an inductor.

8. The system of claim 7, wherein:
    the inductor has an inductance within 30% of 3N times a Josephson inductance of a Josephson junction of the series array of Josephson junctions, and
    N is the number of Josephson junctions in the series array of Josephson junctions.

9. The system of claim 1, wherein the series array of Josephson junctions comprises 3 Josephson junctions.

10. The system of claim 1, wherein the series array of Josephson junctions comprises 5 Josephson junctions.

11. The system of claim 1, wherein the readout circuit is connected to at most 15 nodes of the series array of Josephson junctions.

12. The system of claim 1, further comprising a data transmission channel connected to the series array of Josephson junctions.

* * * * *